United States Patent
May et al.

(10) Patent No.: US 11,430,740 B2
(45) Date of Patent: Aug. 30, 2022

(54) MICROELECTRONIC DEVICE WITH EMBEDDED DIE SUBSTRATE ON INTERPOSER

(71) Applicant: Intel Corporation, Santa Clara, CA (US)

(72) Inventors: Robert Alan May, Chandler, AZ (US); Islam A. Salama, Scottsdale, AZ (US); Sri Ranga Sai Boyapati, Chandler, AZ (US); Sheng Li, Gilbert, AZ (US); Kristof Darmawikarta, Chandler, AZ (US); Robert L. Sankman, Phoenix, AZ (US); Amruthavalli Pallavi Alur, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 54 days.

(21) Appl. No.: 16/474,026

(22) PCT Filed: Mar. 29, 2017

(86) PCT No.: PCT/US2017/024795
§ 371 (c)(1),
(2) Date: Jun. 26, 2019

(87) PCT Pub. No.: WO2018/182597
PCT Pub. Date: Oct. 4, 2018

(65) Prior Publication Data
US 2019/0341351 A1    Nov. 7, 2019

(51) Int. Cl.
*H01L 23/52* (2006.01)
*H01L 23/31* (2006.01)
(Continued)

(52) U.S. Cl.
CPC .......... *H01L 23/5389* (2013.01); *H01L 21/56* (2013.01); *H01L 21/6835* (2013.01);
(Continued)

(58) Field of Classification Search
CPC ............. H01L 23/5389; H01L 23/3128; H01L 23/5381; H01L 23/5221; H01L 24/19;
(Continued)

(56) References Cited

U.S. PATENT DOCUMENTS 6,713,860 B2 * 3/2004 Li ........................... H01J 9/326
257/698
8,026,576 B2 * 9/2011 Murayama ............ H01L 23/585
257/603
(Continued)

FOREIGN PATENT DOCUMENTS

WO    WO-2018182597 A1    10/2018

OTHER PUBLICATIONS

"International Application Serial No. PCT/US2017/024795, International Search Report dated Dec. 27, 2017", 3 pgs.
(Continued)

*Primary Examiner* — Ida M Soward
(74) *Attorney, Agent, or Firm* — Schwabe, Williamson & Wyatt P.C.

(57) ABSTRACT

Microelectronic devices with an embedded die substrate on an interposer are described. For example, a microelectronic device includes a substrate housing an embedded die. At least one surface die is retained above a first outermost surface of the substrate. An interposer is retained proximate a second outermost surface of the substrate.

13 Claims, 8 Drawing Sheets

(51) Int. Cl.
  *H01L 25/07* (2006.01)
  *H01L 25/11* (2006.01)
  *H01L 23/538* (2006.01)
  *H01L 21/56* (2006.01)
  *H01L 21/683* (2006.01)
  *H01L 23/00* (2006.01)
  *H01L 25/065* (2006.01)

(52) U.S. Cl.
  CPC .......... *H01L 23/3128* (2013.01); *H01L 24/19* (2013.01); *H01L 24/25* (2013.01); *H01L 24/82* (2013.01); *H01L 25/0652* (2013.01); *H01L 25/0655* (2013.01); *H01L 25/071* (2013.01); *H01L 25/112* (2013.01); *H01L 2221/68359* (2013.01); *H01L 2221/68372* (2013.01); *H01L 2224/0401* (2013.01); *H01L 2224/16235* (2013.01); *H01L 2224/16238* (2013.01); *H01L 2224/22* (2013.01); *H01L 2224/224* (2013.01); *H01L 2224/24226* (2013.01); *H01L 2224/73103* (2013.01); *H01L 2224/73104* (2013.01); *H01L 2224/73203* (2013.01); *H01L 2224/73204* (2013.01); *H01L 2224/73209* (2013.01); *H01L 2224/73217* (2013.01); *H01L 2224/73267* (2013.01); *H01L 2924/15311* (2013.01)

(58) Field of Classification Search
  CPC ..... H01L 24/25; H01L 24/82; H01L 25/0652; H01L 25/0655; H01L 2224/24336; H01L 2224/73103; H01L 2224/73104; H01L 2224/73203; H01L 2224/73209; H01L 2224/73217; H01L 2224/73204; H01L 2224/224; H01L 2224/22; H01L 25/071; H01L 25/112; H01L 2224/73267; H01L 2924/15311
  See application file for complete search history.

(56) References Cited

U.S. PATENT DOCUMENTS

| | | | |
|---|---|---|---|
| 8,304,913 B2 | 11/2012 | Nalla et al. | |
| 8,692,368 B2* | 4/2014 | Pan | H01L 23/642 257/724 |
| 8,736,065 B2 | 5/2014 | Gonzalez et al. | |
| 8,779,553 B2* | 7/2014 | Rahman | H01L 23/49827 257/618 |
| 8,901,748 B2* | 12/2014 | Manusharow | H01L 24/20 257/777 |
| 9,106,229 B1* | 8/2015 | Hutton | H01L 25/105 |
| 9,111,870 B2* | 8/2015 | Vincent | H01L 24/30 |
| 9,136,236 B2* | 9/2015 | Starkston | H01L 23/5226 |
| 9,147,663 B2* | 9/2015 | Liu | H01L 24/16 |
| 9,275,955 B2 | 3/2016 | Mahajan et al. | |
| 9,349,703 B2* | 5/2016 | Chiu | H05K 3/4694 |
| 9,443,824 B1* | 9/2016 | We | H01L 23/5384 |
| 9,595,509 B1* | 3/2017 | Yap | H01L 24/20 |
| 9,607,967 B1 | 3/2017 | Shih | |
| 9,673,131 B2* | 6/2017 | Hu | H01L 21/561 |
| 9,685,414 B2* | 6/2017 | Shuto | H01L 25/117 |
| 9,978,735 B2* | 5/2018 | Foo | H01L 25/0657 |
| 9,997,446 B2* | 6/2018 | Kim | H01L 21/4857 |
| 10,020,262 B2* | 7/2018 | Alur | H01L 23/5384 |
| 10,068,874 B2* | 9/2018 | Nelson | H01L 25/0652 |
| 10,163,861 B2* | 12/2018 | Yu | H01L 23/49816 |
| 10,224,272 B2* | 3/2019 | Kim | H01L 23/5383 |
| 10,748,870 B2* | 8/2020 | Yu | H01L 25/0652 |
| 10,867,961 B2* | 12/2020 | Hu | H01L 24/97 |
| 10,916,514 B2* | 2/2021 | Kim | H01L 24/14 |
| 2007/0018333 A1 | 1/2007 | Tsai et al. | |
| 2011/0248397 A1* | 10/2011 | Coffy | H01L 24/19 257/E21.705 |
| 2011/0285005 A1 | 11/2011 | Lin et al. | |
| 2011/0291283 A1* | 12/2011 | Chi | H01L 25/105 257/773 |
| 2012/0161331 A1* | 6/2012 | Gonzalez | H01L 23/5389 257/774 |
| 2013/0105973 A1 | 5/2013 | Gan et al. | |
| 2014/0264791 A1* | 9/2014 | Manusharow | H01L 23/5385 438/107 |
| 2014/0299999 A1* | 10/2014 | Hu | H01L 24/19 257/774 |
| 2015/0279817 A1* | 10/2015 | Zhang | H05K 3/4694 257/777 |
| 2016/0056102 A1* | 2/2016 | Konchady | H01L 23/5383 174/263 |
| 2016/0086930 A1* | 3/2016 | Koey | H01L 21/486 257/773 |
| 2016/0276307 A1 | 9/2016 | Lin | |
| 2016/0329284 A1* | 11/2016 | We | H01L 23/5386 |
| 2017/0301625 A1* | 10/2017 | Mahajan | H01L 24/73 |
| 2018/0005945 A1* | 1/2018 | Pietambaram | H01L 23/5385 |
| 2018/0040548 A1* | 2/2018 | Kim | H01L 25/0657 |
| 2018/0337135 A1* | 11/2018 | Yoshihiro | H01L 21/561 |
| 2018/0374788 A1* | 12/2018 | Nakagawa | H01L 24/13 |
| 2019/0013271 A1* | 1/2019 | Liu | H01L 23/5386 |
| 2019/0122985 A1* | 4/2019 | Nelson | H01L 21/76838 |
| 2019/0355642 A1* | 11/2019 | Brown | H01L 23/3142 |
| 2020/0243448 A1* | 7/2020 | Qian | H01L 24/24 |
| 2021/0296240 A1* | 9/2021 | Mekonnen | H01L 24/18 |

OTHER PUBLICATIONS

"International Application Serial No. PCT/US2017/024795, Written Opinion dated Dec. 27, 2017", 10 pgs.

* cited by examiner

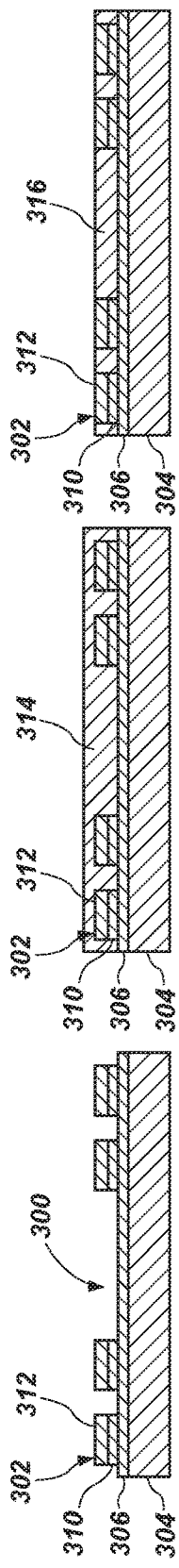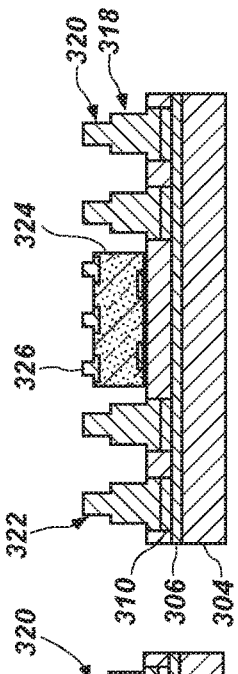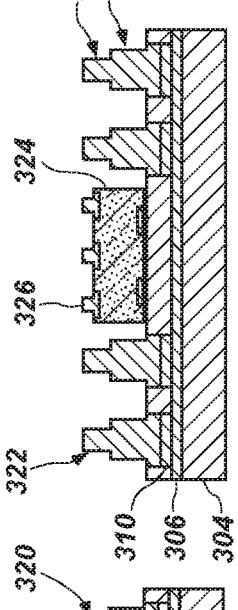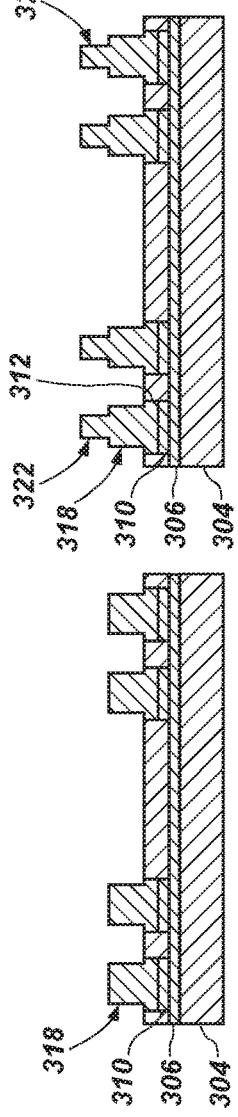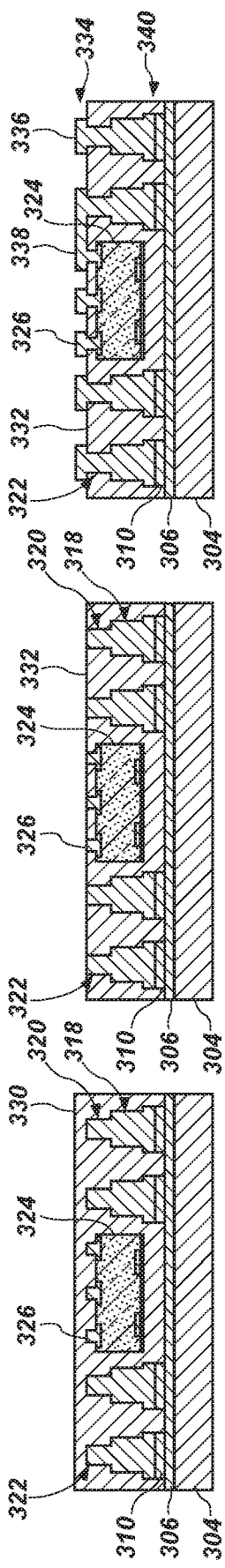

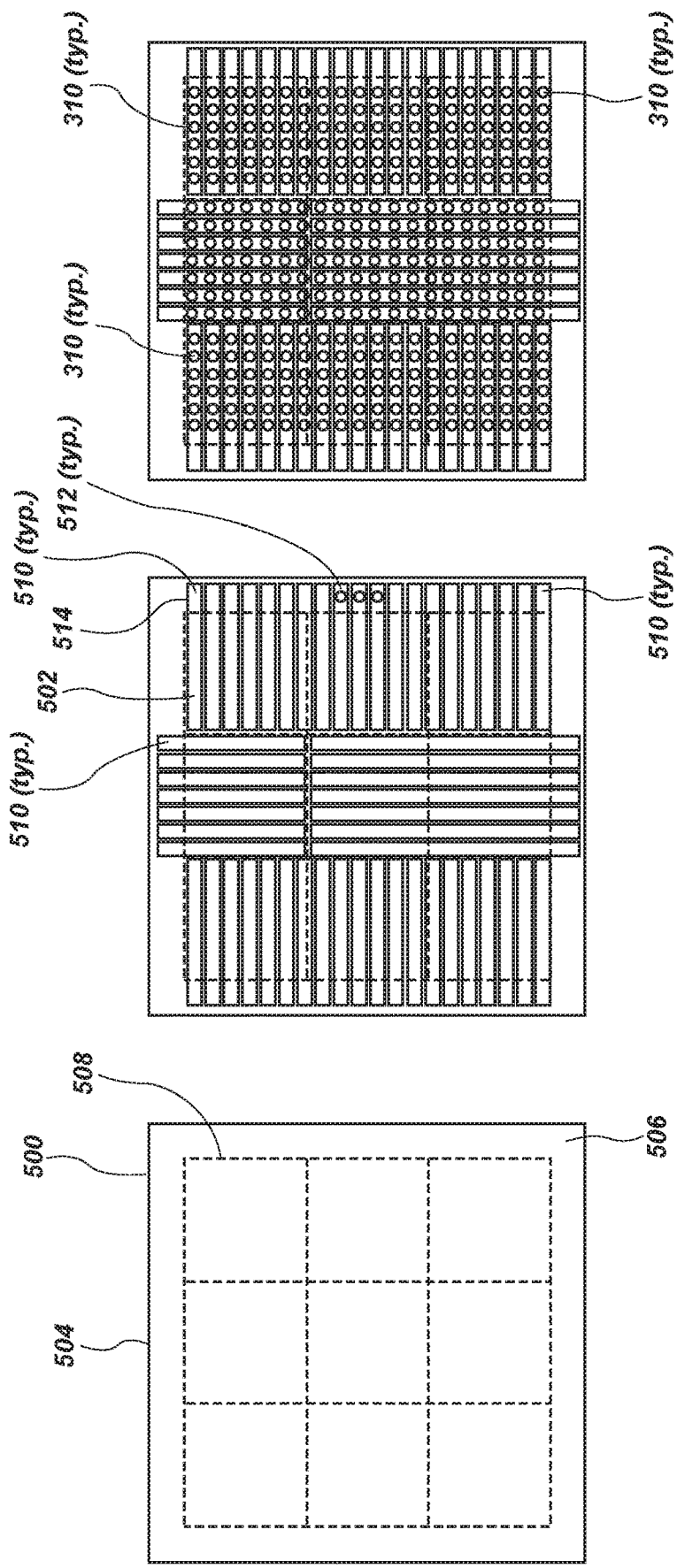

MICROELECTRONIC DEVICE WITH EMBEDDED DIE SUBSTRATE ON INTERPOSER

CLAIM OF PRIORITY

This application is a U.S. National Stage Application under 35 U.S.C. 371 from International Application No. PCT/US2017/024795, filed Mar. 29, 2017, published as WO 2018/182597, which is incorporated herein by reference in its entirety.

TECHNICAL FIELD

Embodiments described herein relate generally to methods and apparatus for forming microelectronic devices including embedded die substrates, and components thereof; and more particularly relate to methods and apparatus for forming and providing embedded die substrates in combination with an interposer in microelectronic devices.

BACKGROUND

Many forms of microelectronic devices, such as IC (integrated circuit) packages, include a substrate supporting one or more devices (referred to herein as "die"), embedded within the substrate (i.e., retained at least partially beneath a surface of the substrate). In many examples, such microelectronic devices may have one or more semiconductor die coupled above the surface of the substrate. The embedded die can be of various configurations. For example, in some example applications the embedded die may be a "passive" component, providing only conductive pathways (referred to herein as a "bridge" die) and in other example applications the embedded die may be an "active" die, containing additional electrical circuit elements, as discussed later herein.

The embedding of a die within a substrate of a microelectronic device, whether a bridge die or an active die, provides many advantages. However, conventional processes used to manufacture such embedded die substrates can be prone to inconsistencies, leading to either yield losses for the substrates or complications in integrating the substrates with other structures (such as surface die). For example, conventional processes for forming an embedded die substrate typically define multiple transverse routing layers within the substrate, and are typically formed through use of a buildup process, such as, for example, a vacuum lamination process. In such conventional build up processes multiple layers of dielectric are successively laminated over respective routing layers, often formed by a semi-additive process (SAP) of metallization (such as plated copper). Such substrates formed through a buildup process over these metal transverse routing layers can result in variations in bump height (top) (BTV). The limitations of substrates formed through this process are further exacerbated by embedding of multiple die within the substrate, since the die may have different thicknesses (i.e., in the vertical or Z-dimension). Both types of variation become more problematic as bump pitch scaling is reduced. Additionally, in the future, it may be anticipated that substrates may need to have relatively increased lateral dimensions (i.e., in the X-Y plane) to accommodate higher die counts, which can be expected to also require greater numbers of embedded die. Thus the limitations experienced with conventional processes discussed above are expected to become increasingly problematic for future devices.

BRIEF DESCRIPTION OF THE DRAWINGS

FIG. 5A-C depicts an example configuration for a carrier suitable for use in the example processes of FIGS. 3A-O and/or 4A-F.

DESCRIPTION OF EMBODIMENTS

Figure 1:
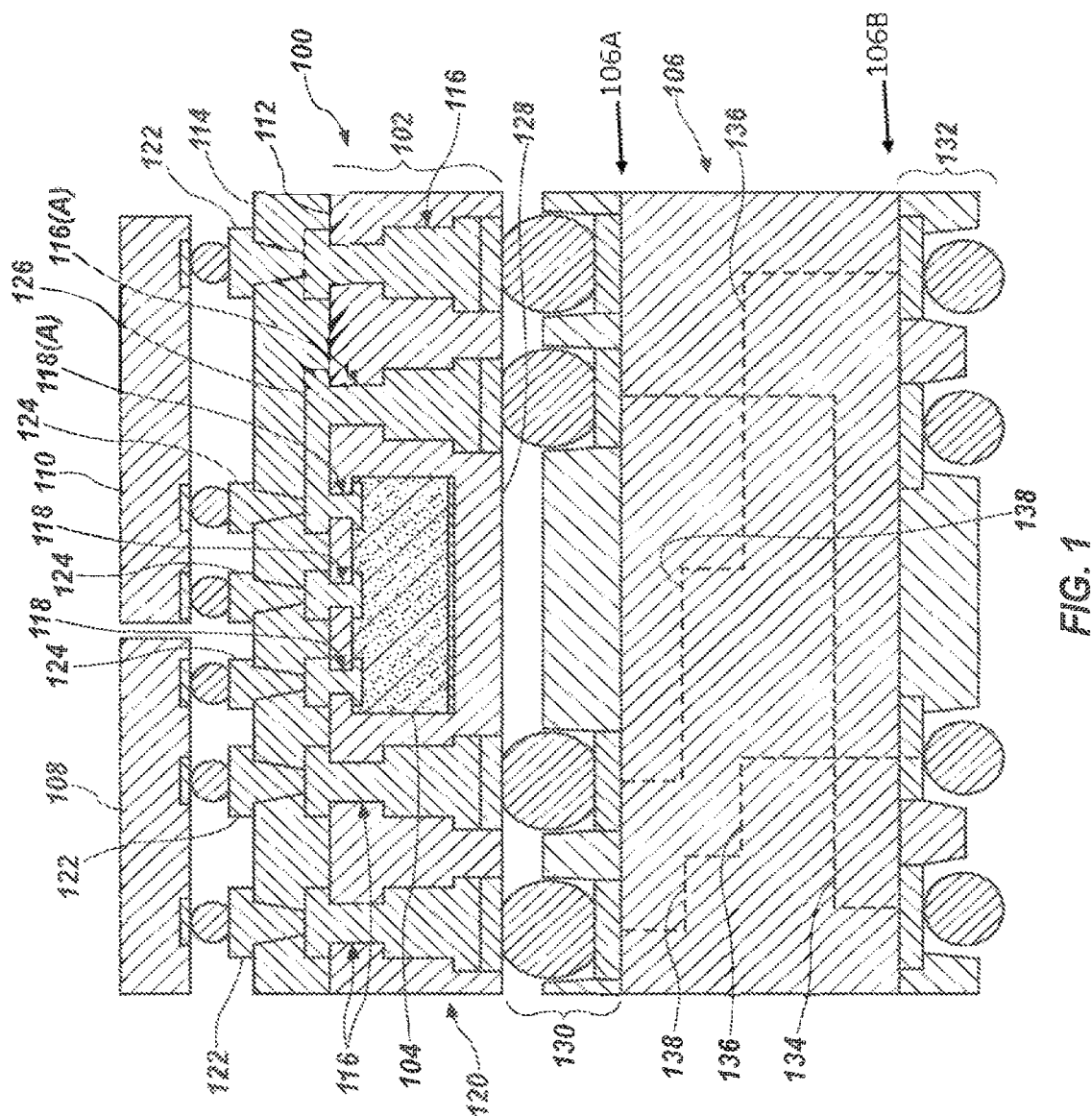
FIG. 1 depicts a simplified cross section of a schematic representation of an example microelectronic device having an embedded die substrate and an interposer, incorporating the techniques and structures described herein.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

The present description addresses example embodiments of a novel microelectronic device including an embedded die substrate on an interposer, and example embodiments of processes for manufacturing such an embedded die substrate, as well as electronic systems incorporating the novel microelectronic device including the embedded die on interposer structure. In some examples as described herein, the embedded die substrate houses one or more embedded die in a substrate particularly suitable for improved yield in manufacturing. In many examples, the embedded die substrate includes vertical through contacts extending through the substrate dielectric. For purposes of the present description such vertical contacts are also termed herein "through silicon vias" ("TSVs") though in the described structures and techniques the through contacts of the embedded die substrate extend through a dielectric body, rather than silicon. Similarly, such vertical through contacts extending through the embedded die are similarly referred to as "TSVs", even though the embedded die may not include a silicon substrate or layer (for example as is the case in many examples of bridge die).

In many examples, the embedded die substrate may further include contacts extending from one or more surfaces to the one or more embedded die. The substrate is formed to include no more than a single transverse (i.e., in the lateral/horizontal direction) routing layer (i.e., a single layer containing one or more transverse routing traces). In some examples, all conductive structures in the substrate may be either through contacts extending completely through the substrate or vias extending from either an upper surface or a lower surface to an embedded die. In other examples, a single transverse routing layer may be provided proximate an upper surface of the substrate (either within the structure of the substrate or disposed on a surface of the substrate), proximate a lower surface of the substrate (for example, in a lower metallization layer of the substrate), or intermediate the substrate (vertically offset from both the upper and lower surfaces of the substrate).

The embedded die can be of various configurations. For example, in some examples the embedded die may be a "passive" component, providing only conductive pathways (referred to herein as a "bridge" die). In many such examples, such a bridge die may be used to provide interconnections between two or more semiconductor die secured above the surface of the substrate (termed herein, "surface die"). As a result, in such examples, multiple contacts extending from the substrate surface to the bridge die may be used to facilitate such interconnections.

In many examples, such an embedded die may be formed on or include a semiconductor substrate, and thus such die may be generally referred to as a "semiconductor die." In other examples, however, the embedded bridge die may be formed without any layers of semiconductor material, and thus are referred to only as a "die." Such bridge die may be used to simplify construction of the supporting substrate, by facilitating customization of interconnects for a specific application (such as for providing connections for one of multiple possible configurations of surface die).

In other example applications, the embedded die may include active circuit components beyond simple conductive interconnects. Such a die with active circuit components can include circuitry ranging from including relatively simple circuits (such as, for example, filters, voltage limiters, and the like), to much more complex circuits including, for example transistors, fuses or anti-fuses, and/or other programmable elements (such as programmable logic devices (PLMs), field programmable logic arrays (FPGAs), etc.), and/or processing (instruction executing) capabilities. For purposes of the present description, the terminology of a "bridge" die will be used for any die having only interconnect structures providing circuit pathways; and the terminology of an "active" die will be used for any die having circuit devices beyond those of a bridge die. Additionally, the current description uses the term "embedded die" to refer to a die which is, or will be, upon completion of the substrate, embedded within the substrate.

In accordance with the current disclosure, most transverse redistribution routing layers are eliminated from the substrate, such that the substrate includes no more than a single transverse routing layer. As a result, redistribution functionality is allocated to an interposer that is operably coupled to the embedded die substrate. In many examples, the substrate will be coupled directly to the interposer through appropriate contact structures. The described structure with a single transverse routing layer simplifies the manufacturing of the embedded die substrate, thereby improving the potential yield of the embedded die substrates. Additionally, as described later herein, the embedded die substrates may be manufactured through a process offering improved dimensional control.

The interposer may be constructed in a conventional manner as is known to persons skilled in the art. In many examples, many of the contact pads or other contact structures at the upper and lower surfaces of the interposer may be at relatively wider pitches that at least some of the vertical vias in the embedded die substrate (such as, for example, some vertical vias in the substrate extending to embedded die in the substrate).

Referring now to the drawings in more detail, and particularly to FIG. 1, the figure depicts a simplified schematic representation of an example configuration of a microelectronic device 100 demonstrating the construction discussed above. Microelectronic device 100 includes an embedded die substrate, indicated generally at 102, housing an embedded die 104. Embedded die substrate 102 is secured to an interposer, indicated generally at 106. A first surface die 108 and a second surface die 110 are coupled over a first surface 112 of embedded die substrate 102.

Embedded die substrate 102 further includes first and second groups of vertical contacts, indicated generally at 116 and 118, respectively, extending within a dielectric body, indicated generally at 120. The first group of vertical contacts 116 form through contacts (TSVs) extending through the entire dimension of dielectric body 120; while vertical contacts 118 extend to engage embedded die 104. As will be discussed in more detail relative to FIGS. 3A-O, embedded die substrate 102 may include one or more types of dielectric material, such as, for example, any one or more of polyimide, polyamide, and epoxy resin (commonly with a filler, such as a silica filler, such as, for example, the epoxy resin sold under the trade name "Ajinomoto Build-up Film" (ABF)), as well as other dielectrics known to persons skilled in the art. Additionally, the dielectric material may be formed around the embedded die 104. In some examples, the dielectric material and the conductive material of the first and second groups of vertical contacts 116, 118 (or only a single group of contacts in some examples) may both be formed (at least in part) in multiple layers of such materials.

Due in part to the greater vertical dimension of the first group of vertical contacts 116, at least a portion of this group of contacts are arranged at a wider pitch relative to one another than are contacts 118. In the depicted example, an insulative layer 114, such as solder resist, is placed over the first surface 112 of embedded die substrate 102, and contact pads, as indicated generally at 122 and 124, extend through insulative layer 114 to engage vertical contacts 116 and 118, respectively. In other examples, the solder resist or other insulative layer 114 may be omitted, and a different configuration of contact structure may be utilized to facilitate electrical and mechanical coupling of one or more surface die 108, 110 directly to embedded die substrate 102.

Embedded die substrate 102 includes an optional transverse routing trace 126, extending transversely to redistribute signals between two laterally offset vertical locations (in the depicted illustrative example, extending between the vertical contact 118(A) extending to embedded die 104 and a vertical contact 116(A). Though a single transverse routing trace 126 is depicted; persons skilled in the art will recognize that when such a layer is present, multiple routing traces may be formed in the layer to form connections between respective laterally offset locations. In the depicted example, the optional transverse routing trace 126 is formed in a layer at upper surface 112 of embedded die substrate 102. In other examples, the transverse routing layer may be formed within the lower surface 128 of embedded die substrate 102 (for example, as a part of the lower metallization layer); or in some examples may be formed internal to substrate 102 (i.e. at some location between a surface 112 and lower surface 128 of embedded die substrate 102).

Interposer 106 is coupled to embedded die substrate 102 to electrically communicate therewith. In the present example, interposer 106 may be configured to serve the function of a package substrate for microelectronic device 100. As a result, interposer 106 may be configured to provide a desired interconnect routing between embedded die substrate 102 (and potentially devices coupled thereto, such as surface die 108, 110) and structures external to microelectronic device 100. Interposer 106 has a first surface 106A and an opposing second surface 106B.

Interposer 106 provides upper contacts, indicated generally at 130, and lower contacts, indicated generally at 132, and provides electrical interface routing between the upper and lower contacts 130, 132. Appropriate layers of transverse redistribution structures (for example, three layers of transverse redistribution of traces are schematically represented 134, 136, and 138) facilitate the redistribution. The example transverse redistribution of traces of each level may be connected directly to an adjacent level or to another vertically offset location) by vertical interconnects (such as micro-vias, or analogous structures, as known to persons skilled in the art). In some examples, interposer 106 may include one or more layers formed of semiconductor material, such as silicon, gallium, indium, germanium, or variations or combinations thereof; and/or one or more insulating layers, such as glass-reinforced epoxy (such as FR-4), polytetrafluoroethylene (Teflon), cotton-paper reinforced epoxy (CEM-3), phenolic-glass (G3), paper-phenolic (FR-1 or FR-2), polyester-glass (CEM-5), as well as many other example dielectric materials, and combinations of the above. In many examples, interposer 106 may be formed through a buildup process, either on a core or in a coreless configuration; and a micro via formation process, such as laser drilling, followed by metal fill, can be used to form interconnections between conductive layers in the buildup and die bond pads.

Figure 2:
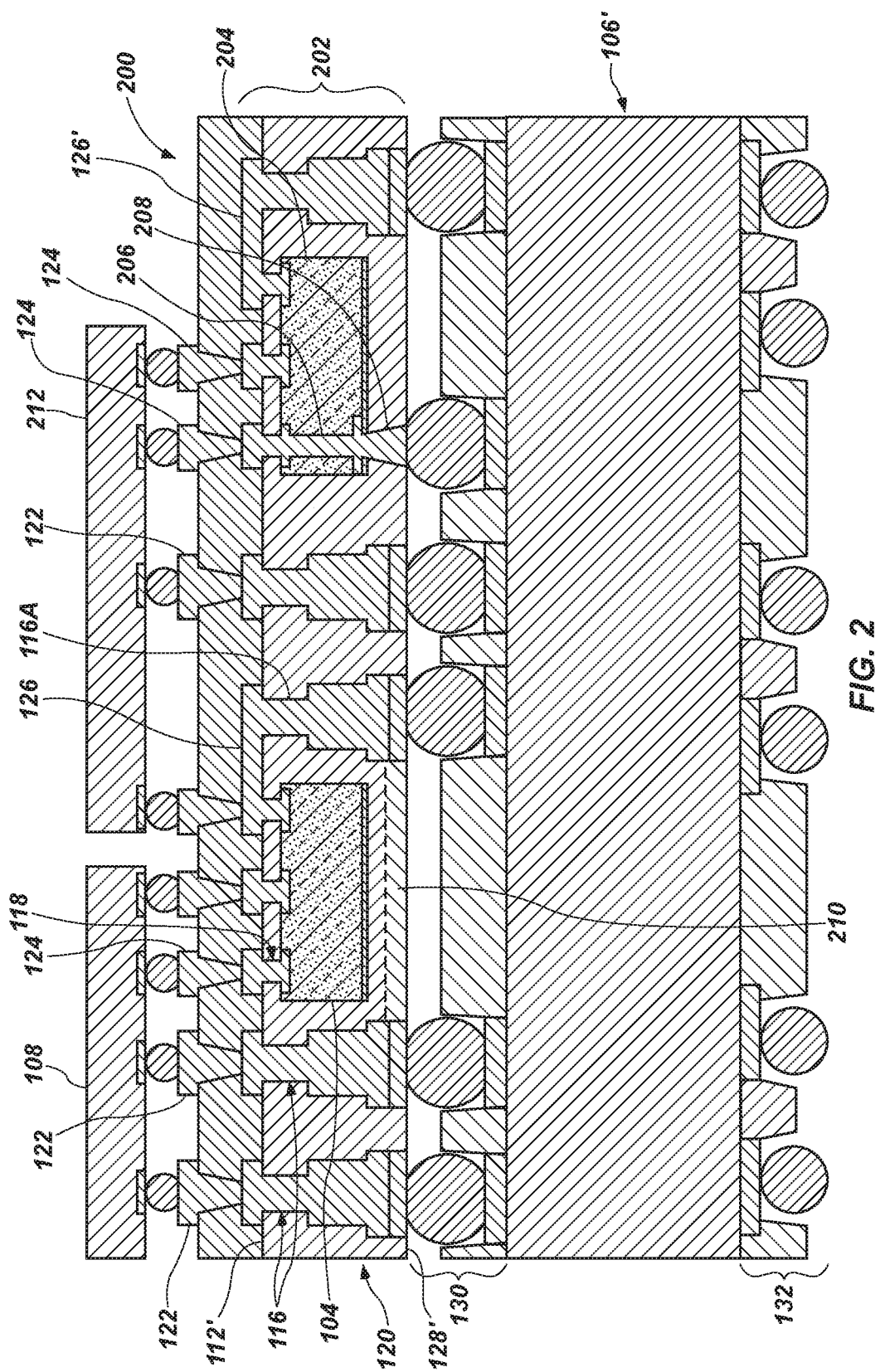
FIG. 2 depicts a simplified cross section of a schematic representation of an alternative embodiment of an example microelectronic device having an embedded die substrate and an interposer, incorporating the techniques and structures described herein.

Referring now to FIG. 2, the figure depicts a simplified cross section of a schematic representation of an alternative embodiment of an example microelectronic device 200 having an embedded die substrate and an interposer. Many of the depicted structures in microelectronic device 200 are essentially identical to structures of microelectronic device 100 of FIG. 1. Accordingly, such essentially identical structures are identified with the same numbers as used in FIG. 1, and except as useful for illustration, the description of those components will not be repeated relative to FIG. 2. Structures we may which may not be identical but are directly analogous are indicated by a prime, for example, such as 112'.

Microelectronic device 200 differs from microelectronic device 100 of FIG. 1 primarily in the following respects: substrate 202 is of an expanded dimension, and houses a second embedded die 204; second surface die 212 extends to contact not only first embedded die 104, but also includes contacts extending to second embedded die 204; second embedded die 204 is of an example configuration including a vertical through contact 206 (which in some examples may be a characteristic of any or all embedded die within a substrate), such as a TSV through the die; substrate 202 includes an additional lower surface vertical contact 214 extending to through contact 206 of embedded die 204; and substrate 202 schematically depicts an optional alternative placement (as discussed above) for the single layer of transverse redistribution structures 210, within the dimensions of dielectric body 120' (i.e., within the dimension between upper surface 112' and lower surface 128' of substrate 202).

Addressing second embedded die 204, as with the first embedded die 104, second embedded die may be either a bridge die or an active die, and can be of any desired configuration. Though first and second embedded die are depicted in FIG. 2, as will be apparent to persons skilled in the art many more embedded die may be supported within substrate 202. As noted above in this example, for purposes of illustration, second embedded die 204 includes an example vertical through contact 206. As will be apparent to persons skilled in the art, an embedded die may commonly include multiple vertical through contacts, at least some of which may be arranged in an array at a desired pitch relative to one another. The presence of a vertical through contact 206 may commonly result in the need for a lower surface vertical contact 208 extending to second embedded die 204 to facilitate connection to interposer 106' as shown. In other examples, a vertical through contact 206 may engage a transverse redistribution structure beneath the embedded die, as in a layer in an alternative placement, as indicated at 210.

Figures 3J, 3K, 3L:
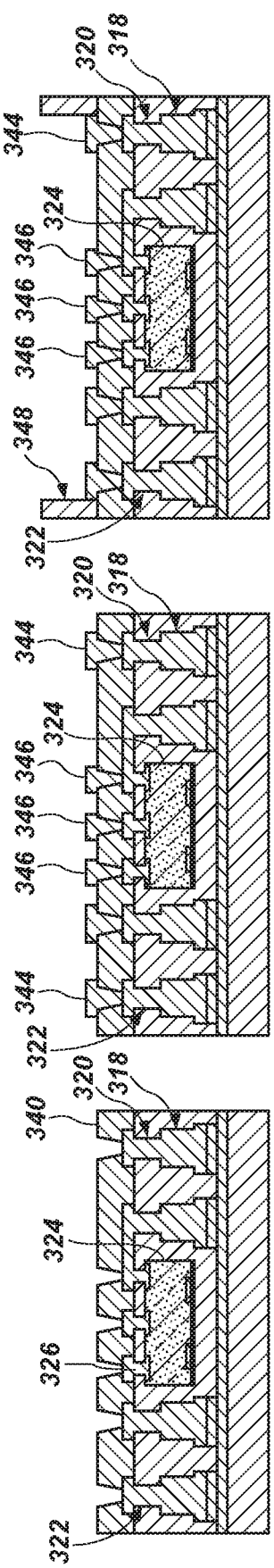
FIGS. 3A-O depict sequential stages in an example process for forming an embedded die substrate, incorporating the techniques and structures described herein.
Figures 3M, 3N, 3O:
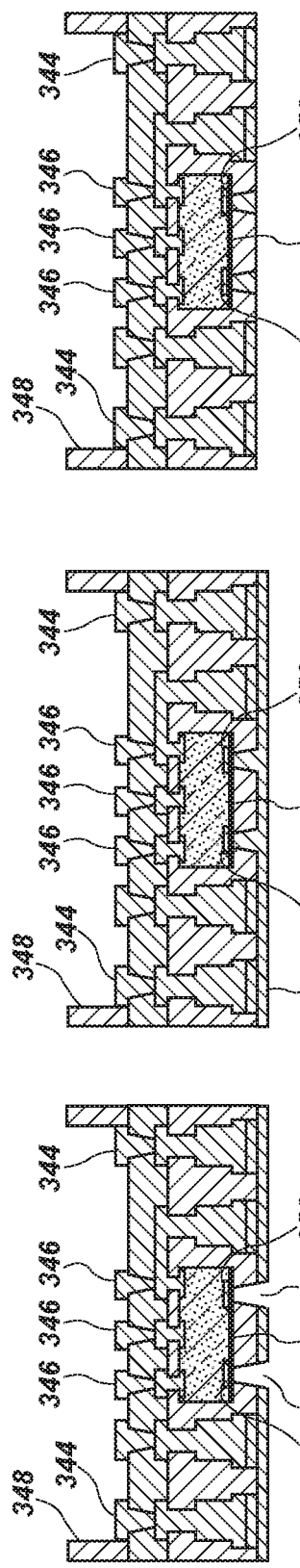

Referring now to FIGS. 3A-O, the figures depict simplified schematic representations of sequential representative stages in an example process for forming an embedded die substrate incorporating the techniques and structures described herein. As depicted in FIG. 3A, one or more initial patterned metallization layers 302 are formed on a carrier structure, indicated generally 300. In some examples, carrier structure 300 includes a support structure 304 defining a planar support surface over which the embedded die substrate may be formed. In some examples, carrier structure 300 may also include a release layer or other surface layer 306 on the planar surface of support structure 304. For purposes of the present example, carrier structure 300 includes support structure 304 having a metallic surface layer formed thereon, for example a copper foil 306. As will be discussed in reference to FIG. 5, copper foil layer 306 may be patterned in a desired manner, for example an arrangement of one or more groups of parallel strips to facilitate desired electrical connection to conductive structures of the embedded die substrate to be formed, which may facilitate testing or other electrical evaluations of the substrate structures.

The metallization layers 302 can be of any desired form for forming a bottommost portion of vertical contacts (or other conductive structure) of the substrate. While a single metallization layer may be used, in the depicted example a surface treatment layer 310 may be formed of a desired metal, with a conductive contact material 312 formed thereon. Such a surface treatment layer 310 may include one or more of nickel, tin-silver etc. In many examples, the conductive contact material 312 may be copper, though other conductive metals or alloys may be utilized. The metallization layers 302 can be formed through desired processes known to those skilled in the art. For example, for many materials, a semi-additive process (SAP), may be used to form the patterned structures for these lower metallization layers 302. In examples such as that depicted, wherein carrier structure 300 includes a metal layer such as copper foil layer 306, such layer can be used to facilitate electroplating of surface treatment layer 310 and subsequently also of conductive contact material 312.

The embedded die substrate may include a dielectric body in which the embedded die is retained. In some examples, a first portion of the dielectric body may extend beneath the embedded die 104, and a second portion of the dielectric body may extend above the first portion. In some examples both the first portion of the dielectric body and the second portion may have planarized surfaces, as described below. Such planarized surfaces may be formed by grinding, chemical mechanical planarization CMP), or another known technique, also as described below.

Referring now to FIG. 3B, a dielectric layer 314 has been deposited over the structure of FIG. 3A to a dimension sufficient to cover lower metallization layers 302. Dielectric layer 314 can be any of the materials as discussed above, including polyamide, polyimide, epoxy resins, etc., as discussed above. In FIG. 3C, dielectric layer 314 has been planarized, such as through grinding, CMP, etc., to form a planarized surface 316. Thus, dielectric layer 314 forms the above-indicated first portion of the dielectric body of the embedded die substrate that will be formed.

The planarization (or other planarization process) may be configured to stop at the surface of metallization layers 302 such that planar surface 316 is formed in part by exposed upper surfaces of lower metallization layers 302. The described formation of the first metallization layers 302 on the carrier prior to the forming of the dielectric layer offers significant advantages in many examples, in facilitating establishing a controlled dimension of the substrate beneath an embedded die, and providing a planar surface 316 for supporting the embedded die.

In some examples, where contacts will be provided from a lower surface of the embedded die substrate, such as to extend to an embedded die (as discussed relative to second embedded die 204 and contact 208 in FIG. 2), first metallization layers 302 may further include metallization for such a contact intended for contacting the embedded die. However, in many examples, due to the relatively limited dimension of dielectric layer 314, such contacts may be formed through laser drilling and metallization within the via after completion of the substrate formation (as discussed relative to FIGS. 3M-N).

Referring now to FIG. 3D, a second metallization layer 318 may be formed over at least some portion of patterned metallization layers 302. In many examples, second metallization layer 318 may be formed over the portions of metallization layers 302 configured as a lower portion of vertical contacts. If a portion of first metallization layers 302 were configured to form traces of a transverse routing layer (as discussed relative to FIG. 2), then second metallization layer 318 may not be formed over some or all of such portion of first metallization layers 302. Again, second metallization layer 318 may be formed through SAP process to leave a patterned metallization structure only on selected portions of first metallization layer 302, as desired.

Referring now to FIG. 3E, a third metallization layer, indicated generally at 320, is formed over at least some portion of second metallization layer 318. As discussed relative to second metallization layer 318, in many examples, third metallization layer 320 may be formed over the portions of second metallization layer 318 configured as a portion of vertical contacts. If a portion of second metallization layer 318 were configured to form a transverse routing layer (as discussed relative to FIG. 2), then third metallization layer 320 may not be formed over some or all of such portion of second metallization layers 318. Again, third metallization layer 320 may be formed through SAP process to leave a patterned metallization structure only on selected portions of second metallization layer 318, as desired. In the depicted example, the sequence of the first second and third metallization layers, 302, 318 and 320 forms the vertical through contacts 322 of the embedded die substrate.

In various embodiments, one or both of second metallization layer 318 and third metallization layer 320 may not be necessary. The formation of vertical contacts 322 through the use of second and third metallization layers 318, 320 facilitates building an embedded die substrate control vertical dimension, and with vertical contacts that are externally accessible, simplifying integration of the embedded die substrate into a microelectronic device. In other examples, where the dimensions of an embedded die and the resulting overall height of the embedded die substrate are relatively limited, and are of a vertical dimension such that vias may be drilled (such as by laser drilling) at a spacing consistent with the desired pitch for the vertical contacts, it may be possible to omit one or both of second metallization layer 318 and third metallization layer 320, and to laser drill through dielectric of the embedded die substrate down to first metallization layers 302. The drilled vias may then be filled with the metallization layer, as discussed below.

Referring now to FIG. 3F, an embedded die 324 is placed on planar surface 316 of dielectric layer 314. In some examples, a bonding layer may be utilized to retain embedded die 324 in a fixed relation relative to planar surface 316 during further processing. As shown in FIG. 3G, additional dielectric 330 is then formed over the structure of FIG. 3F, in many examples to a dimension sufficient to completely encase both embedded die 324 (and any contacts 326 thereof) as well as vertical through contacts 322. Additional dielectric 330 may be formed as a single layer, or as multiple layers, as best suits the materials used for the layer. The forming of additional dielectric 330 around embedded die 324 may be expected to result, in many examples, in a more uniform distribution of dielectric around embedded die 324 as compared to some prior art processes in which dielectric is required to fill the remaining portions of a recess in which an embedded die is located.

As shown in FIG. 3H, dielectric 330 is planarized, again such as through use of grinding, CMP or another known technique, to form a planar upper surface 332 which includes upper surfaces of through vertical contacts 322 and contacts 326 of embedded die 324. As a result, dielectric 330 forms the identified second portion of the dielectric body of the embedded die substrate.

As an alternative, in some examples, embedded die may be placed at a level in the embedded die substrate such that contacts 326 are not exposed during the planarization. In such an example, the contacts may then be accessed through laser drilling of the portion of dielectric 330 extending over embedded die 324 and its contacts 326. The structure of embedded die substrate (such as one formed according to some portion of the above example process), including a first planarized dielectric structure supporting one or more embedded die, and a distinct additional dielectric structure formed over the first planarized dielectric structure, as well as the characteristics of the additional dielectric structure, should be observable through use of conventional analytical techniques used in semiconductor device evaluation, such as, for example, one or more of scanning electron microscopy (SEM), transmission electron microscopy (TEM), scanning capacitance microscopy (SCM), X-Ray analysis, secondary ion mass microscopy, and other evaluation methodologies known to persons skilled in the art.

Referring now to FIG. 3I, the embedded die substrate may include an upper metallization layer, indicated generally at 334, formed over planar surface 332. Metallization layer 334, when present, may form landing pads 336 on vertical through contacts 322, and may also form the single layer of transverse routing traces (if not included between the upper and lower surfaces of the embedded die substrate, as discussed earlier herein). Metallization layer 334 may again be formed through a conventional SAP process. When present, the formation of metallization layer 334 completes the formation of the structures of embedded die substrate 340.

Referring now to FIG. 3J, an optional protective layer, such as solder resist 342 may be formed over embedded die substrate 340; and as shown in FIG. 3K, first and second groups of contacts 344 and 346, respectively, are formed extending through solder resist 342. As discussed previously, in many examples, the first group of contacts 344 extending to vertical through vias 322 are at a first pitch, while the contacts 346 extending to contacts 326 of embedded die 324 are at a second pitch, which may commonly be a narrower pitch, as depicted.

Referring now to FIG. 3L, in one option for completing the manufacture of the embedded die substrate 340, a stiffener or temporary carrier 348 is secured to embedded die substrate 340 to facilitate removal of at least a portion of carrier support surface 304, as depicted in FIG. 3M. In the depicted example, carrier support surface 304 is removed leaving patterned foil layer 306 in place. For purposes of illustration, in the depicted example, embedded die 324 includes contact surfaces 350 on the lower surface 352. As a result, vias 354 are drilled to expose contact surfaces 350.

As will be discussed in more detail relative to FIGS. 4A-F, in some processes, testing may be performed of the embedded die substrate during the manufacturing process. Example stages in which such testing might beneficially be performed would include after formation of the solder resist 342 and associated contacts 344, 346, and before removal of the carrier structure 300 (for example after the stages depicted by either of FIG. 3K or 3L above).

Referring now to FIG. 3N, and after any testing (if performed), copper foil layer 306 may be etched away, and an SAP process may be used to deposit metal, such as copper, 356 to fill vias 354 in the lower surface of embedded die substrate 340; and to then remove extraneous metal 356 (or other metallization material), as shown in FIG. 3O.

Referring now to FIGS. 4A-F, the figures depict simplified schematic cross-sections of stages in an example testing process that may be incorporated into the forming of an embedded die substrate such as that depicted and described relative to FIGS. 3A-O. The example embedded die substrate is essentially identical to that formed in reference to FIGS. 3A-O, with the single exception that the embedded die within the substrate does not include lower surface contacts 350, and the embedded die substrate therefore does not include vias 354 in the lower surface. As a result, elements in FIGS. 4A-F, will be numbered identically to their corresponding components in FIGS. 3A-O, the embedded die substrate will be identified as element 340', and the embedded die will be identified as element 324'.

Figure 4A:
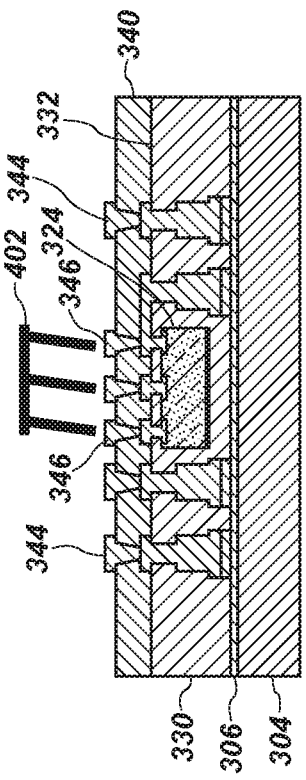
FIGS. 4A-F depict sequential stages in an example process for testing an embedded die substrate as formed in FIGS. 3A-O.

As depicted in FIG. 4A, the formed embedded die substrate 340' is in place on carrier support surface 304 having a conductive layer, such as copper foil 306 formed thereon. As a result, FIG. 4A substantially corresponds to the structure of FIG. 3K, discussed above. As schematically depicted in FIG. 4B, test signals 402 may be applied to the contacts 346 extending to embedded die 340' (in the depicted example the relatively fine pitched contacts). Additionally, to the extent that contacts 346 redistributed through transverse routing traces 338 to vertical through contacts 322, continuity may be tested through electrical connections in copper foil 306.

Referring now also to FIG. 5A-C, the figures depict sequential stages informing an example configuration for a carrier structure 500 including a patterned foil layer 502 suitable for use in the example of FIGS. 4A-F. Substrate such as those described are commonly formed in a grid in a "quarter panel," as indicated generally at 504, and a carrier structure 500 would be configured to support a quarter panel (which may typically have a dimension on the order of 200 to 300 mm). As noted previously, the carrier structure can include a metallization layer, such as a copper foil 506 formed on a planar surface of the carrier structure. As shown in FIG. 5B, copper foil 506 may be patterned to form the patterned foil layer 502, configured to provide isolated conductive elements (indicated typically at 510) accessing groups (for example, rows or columns) of contact arrays to be formed in a grid of embedded die substrates (as indicated in phantom at 508) to be formed on carrier structure 500. FIG. 5C depicts the formation of the first metallization layer (indicated typically at 310) on the conductive elements 510. In some examples, vertical contacts as described during formation of the embedded die substrates may also be formed in the "dummy area" 514, outside the grid 508 of the embedded substrates being formed, as indicated by example at 512. Such dummy area contacts 512 may be formed through the same metallization layers used to define the vertical contacts in the embedded die. Such dummy area contacts 512 facilitate accessing conductive elements 510 individually from an upper surface of the formed quarter panel.

The use of the described conductive elements facilitates testing contacts of an embedded die substrate in a series defined by the array of conductive elements 510. Additionally, at least a portion of the ultimately formed embedded die substrates may be tested in parallel with one or more other substrates on the quarter panel to reduce testing time. Once the testing is completed, as discussed in reference to FIG. 3N, patterned foil layer 502 may be etched from the quarter panel 504, leaving the grid of embedded die substrates 508 for further processing/testing as referenced earlier herein. In many examples, the initial metallization layer (surface treatment layer 310 in FIG. 3A), may serve as an etch stop for removing patterned foil layer 502.

Figure 4C:
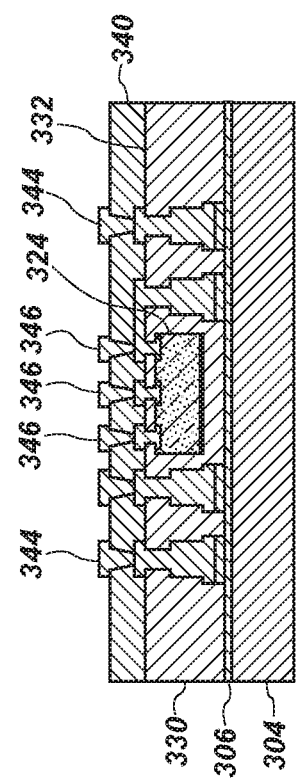
Figure 4E:
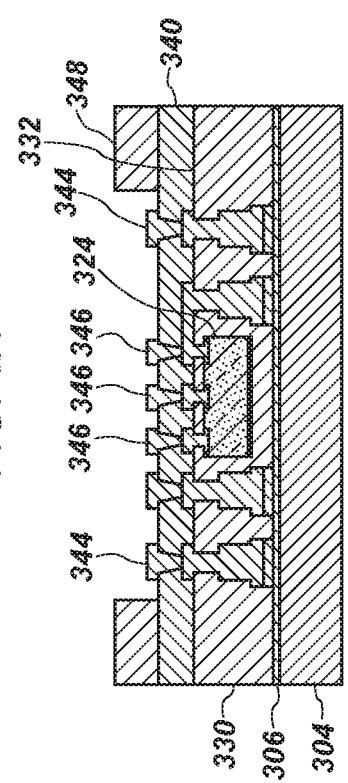
Figure 4B:
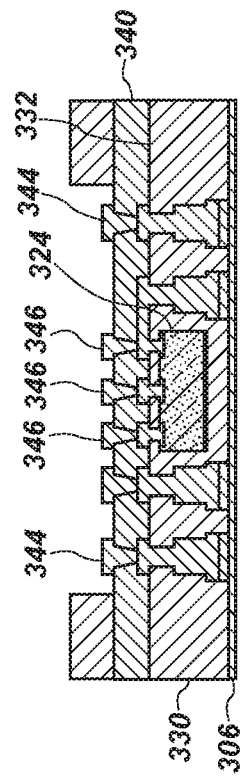
Figure 4D:
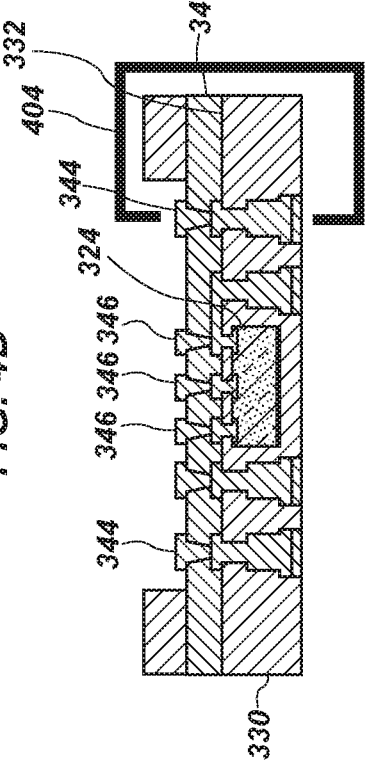

Referring now to FIG. 4C, the stiffener or temporary carrier 348 has been applied, and in FIG. 4D, carrier support surface 304 has been removed exposing patterned copper foil 306 (or element 506 in FIG. 5). The individual conductive elements 510 of patterned copper foil 306 may be accessed to facilitate conductivity testing. As discussed relative to FIG. 5, the conductive elements may be accessed from above if vertical contacts for testing are formed in the dummy area outside the dimensions of the embedded substrates (as shown at 512 of FIG. 5).

Figure 4F:
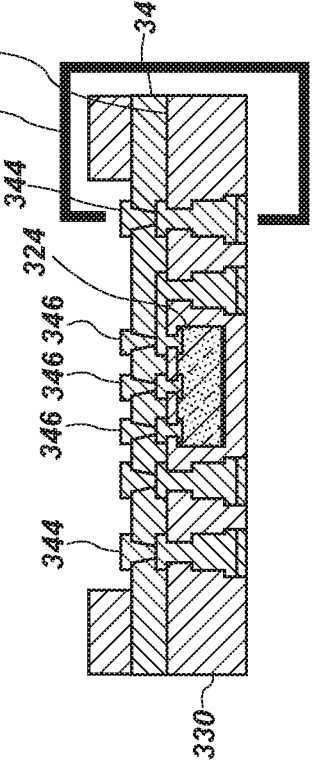

In FIG. 4E, the patterned copper layer 306 has been removed, enabling individual testing of through contacts, as schematically indicated at 404 in FIG. 4F.

Figure 6:
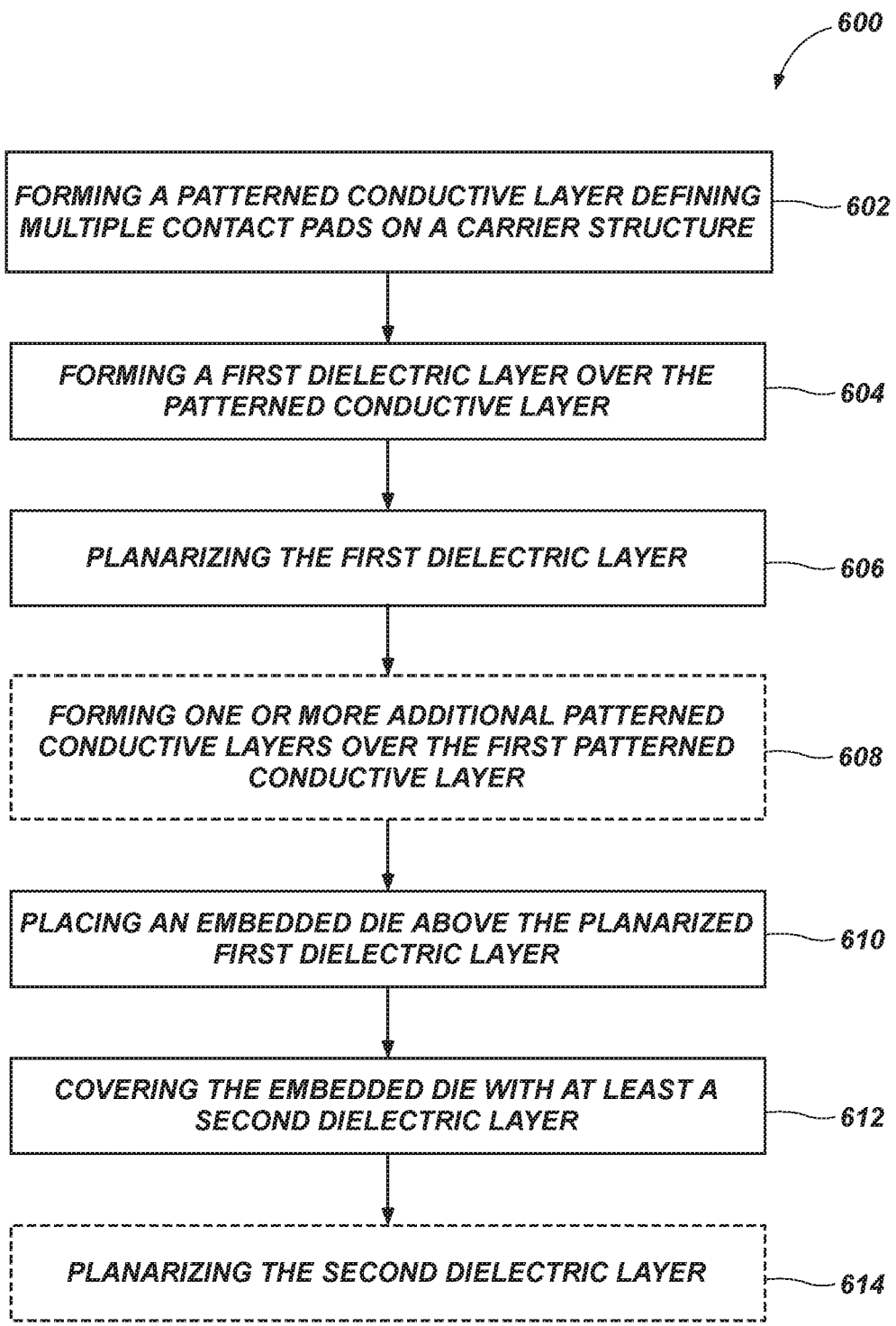
FIG. 6 depicts an example method for forming an embedded die substrate and a device incorporating such embedded die substrate.
Figure 7:
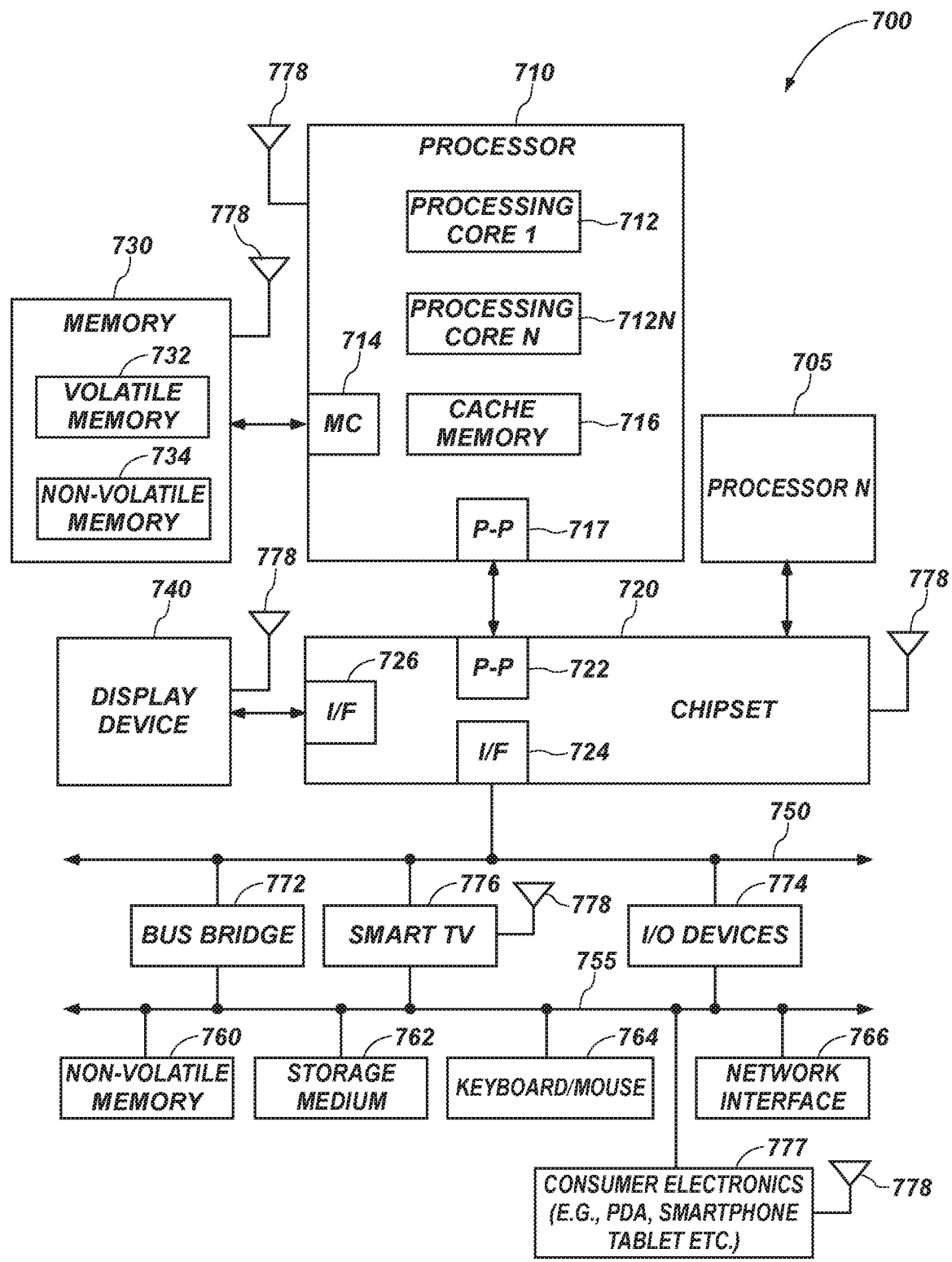
FIG. 7 depicts a system level diagram of an electronic system which may incorporate an embedded die microelectronic device such as any of the microelectronic devices as described herein.

Referring now to FIG. 6, the figure depicts a flowchart of an example method 600 for forming an embedded die substrate in accordance with the discussion above. As indicated at 602, the example method includes forming a first patterned conductive layer defining multiple contact pads on a carrier structure. An example of this is depicted in, and discussed relative to, FIG. 3A. As discussed in reference to that figure, at least a portion of the formed contact pads of this first patterned conductive layer may form the lowermost portion of vertical through contacts in the embedded die substrate.

As indicated at 604, a first dielectric is formed over the first patterned conductive layer (for example, as in FIG. 3B); and as indicated at 606, the first dielectric is then planarized. The planarized first dielectric extends to expose the patterned first conductive layer, an example of which is depicted in FIG. 3C.

As indicated optionally at 608, one or more additional patterned conductive layers may be formed over the first patterned conductive layer, an example of which is depicted in, and discussed relative to FIGS. 3D-E. As discussed in reference to such figures, many example processes will include the formation of one or more additional patterned conductive layers to achieve sufficient height to extend through an embedded die substrate. However, in some applications, if the embedded die is a sufficiently limited height and/or if the contact bump pitch is sufficiently relaxed, it may be possible to form vias from the upper surface of the embedded die dielectric to extend to the first patterned conductive layer.

As indicated at 610, once any additional patterned conductive layers are formed extending above the surface of the planarized first dielectric layer, an embedded die will be placed on that layer, as depicted in, and discussed relative to, FIG. 3F. As indicated at 612, a second dielectric may be formed to cover the embedded die. In many examples, to the extent additional conductive layers have been formed over the first patterned conductive layer to form vertical contacts, the second dielectric may be formed to extend over those vertical contacts.

As indicated at 614, the second dielectric may then be planarized. In many examples, where vertical contacts have been formed, the second dielectric may be planarized to a level to expose the upper surface of such vertical contacts, as depicted in, and discussed relative to FIG. 3H.

As indicated at 616, an option in some examples is to form a conductive layer over the planarized second dielectric. Such a conductive layer may be formed to additional conductive structures, such as either contact/landing pads for contacting the vertical contacts (For example, such as where a solder resist layer may be utilized). In other examples, such a conductive layer over the planarized second dielectric may also serve as a transverse routing layer, as shown at element 338 of FIG. 3I. In other examples, instead of a transverse routing layer being formed above the planarized surface of second dielectric, such a transverse routing layer may be formed as a portion of the first patterned conductive layer, or at a location intermediate the vertically opposed surfaces of the second dielectric. As noted previously, the embedded die substrate may be formed with no more than a single transverse routing layer.

To better illustrate the methods and apparatuses described herein, a non-limiting set of Example embodiments are set forth below as numerically identified Examples.

Example 1 is a microelectronic device, comprising: a substrate housing at least a first embedded die, the substrate comprising, through contacts extending from a first surface of the substrate to an opposing second surface of the substrate, and contacts extending from a first surface to the first embedded die, the substrate having no more than a single layer of transverse routing traces; at least one surface die retained above the first surface of the substrate, the surface die electrically coupled to one or more of the contacts of the substrate; and an interposer retained proximate a second surface of the substrate, the interposer having a first set of multiple interposer contacts on a first surface, the first set of multiple interposer contacts coupled to respective substrate contacts, the interposer containing multiple conductive metal layers redistributing contacts of the first set of multiple interposer contacts to respective locations on an opposing second surface of the interposer.

In Example 2, the subject matter of Example 1 where the substrate comprises a single layer of transverse routing traces.

In Example 3, the subject matter of Example 2 where the single layer of transverse routing traces is proximate a surface of the substrate.

In Example 4, the subject matter of any one or more of Examples 2-3 where the single layer of transverse routing traces is proximate the first surface of the substrate.

In Example 5, the subject matter of any one or more of Examples 2-4 where the single layer of transverse routing traces is proximate a second surface of the substrate opposite the first surface.

In Example 6, the subject matter of any one or more of Examples 2-5 where the single layer of transverse routing traces is formed internal to the substrate.

In Example 7, the subject matter of any one or more of Examples 1-6 where the first embedded die is a bridge die.

In Example 8, the subject matter of any one or more of Examples 1-7 where the first embedded die is an active die.

In Example 9, the subject matter of any one or more of Examples 1-8 optionally include multiple contact surfaces proximate the second surface.

In Example 10, the subject matter of Example 9 where at least a portion of the through contacts in the substrate extend to the contact surfaces proximate the second surface.

In Example 11, the subject matter of any one or more of Examples 9-10 where the multiple contact surfaces proximate the second surface are generally flush with the second surface.

In Example 12, the subject matter of any one or more of Examples 1-11 optionally include a second embedded die.

In Example 13, the subject matter of any one or more of Examples 1-12 where the substrate comprises a dielectric body in which the embedded die is retained.

In Example 14, the subject matter of Example 13 where the dielectric body comprises a first portion extending beneath the embedded die, where the first portion has a first planarized surface proximate the embedded die.

In Example 15, the subject matter of Example 14 where the first planarized surface is formed by grinding or chemical mechanical planarization.

In Example 16, the subject matter of any one or more of Examples 14-15 where the first planarized surface is formed at a level of a first metallization layer of the substrate.

In Example 17, the subject matter of any one or more of Examples 14-16 where the dielectric body further comprises a second portion extending above the first portion and above the embedded die.

In Example 18, the subject matter of Example 17 where the second portion of the dielectric body defines the first surface of the substrate from which the contacts extend.

In Example 19, the subject matter of Example 18 where the first surface of the substrate is a planarized surface formed by grinding or chemical mechanical planarization.

In Example 20, the subject matter of any one or more of Examples 1-19 where at least a portion of the through contacts are arranged at a first pitch relative to one another, and where at least a portion of the contacts to the embedded die are arranged in a second pitch relative to one another, where the second pitch is narrower than the first pitch.

In Example 21, the subject matter of any one or more of Examples 1-20 where the embedded die is completely encased within the substrate, and is supported in spaced relation relative to the second surface.

In Example 22, the subject matter of any one or more of Examples 1-21 where the substrate comprises multiple layers of laminations.

In Example 23, the subject matter of any one or more of Examples 1-22 where the embedded die comprises one or more through silicon vias.

In Example 24, the subject matter of Example 23 where the substrate comprises at least one contact extending from the second surface of the substrate to a respective through silicon via of the embedded die.

Example 25 is a method of forming an embedded die substrate, comprising: forming a first patterned conductive layer defining multiple contact pads on a carrier structure; forming a first dielectric over the first patterned conductive layer; planarizing the first dielectric; placing an embedded die above the planarized first dielectric; covering the embedded die with at least a second dielectric; and planarizing the second dielectric.

In Example 26, the subject matter of Example 25 optionally includes forming one or more additional patterned conductive layers over the first patterned conductive layer; and forming a second group of vertical contacts extending through the second dielectric to the embedded die.

In Example 27, the subject matter of Example 26 where covering the embedded die with at least a second dielectric further comprises covering the one or more additional patterned conductive layers with the second dielectric.

In Example 28, the subject matter of any one or more of Examples 25-27 where the embedded die is placed on the planarized first dielectric.

In Example 29, the subject matter of any one or more of Examples 26-28 optionally include forming a single layer of transverse conductive routing interconnects as a part of the embedded die substrate.

In Example 30, the subject matter of Example 29 where forming a single layer of transverse routing traces comprises forming the transverse routing traces as part of the patterned first conductive layer.

In Example 31, the subject matter of any one or more of Examples 29-30 where forming a single layer of transverse routing traces comprises forming the transverse conductive routing interconnects proximate an upper surface of the substrate.

In Example 32, the subject matter of any one or more of Examples 29-31 where forming a single layer of transverse routing traces comprises forming the transverse conductive routing interconnects internal to the substrate.

In Example 33, the subject matter of any one or more of Examples 29-32 where forming the first group of vertical contacts comprises drilling vias from an upper surface of the substrate.

In Example 34, the subject matter of Example 33 where forming the first group of vertical contacts further comprises forming a patterned conductive layer over the contact pads to form an intermediate contact structure; and where drilling the vias from an upper surface of the substrate comprises drilling vias extending to the intermediate contact structure.

In Example 35, the subject matter of any one or more of Examples 33-34 where forming the first group of vertical contacts comprises drilling vias extending to the contact pads.

In Example 36, the subject matter of any one or more of Examples 26-35 where the embedded die is a bridge die.

In Example 37, the subject matter of any one or more of Examples 26-36 where the embedded die is an active die.

In Example 38, the subject matter of any one or more of Examples 26-37 where the embedded die is a first embedded die, and further comprising placing a second embedded die above the first dielectric.

In Example 39, the subject matter of Example 38 where the first embedded die is a bridge die, and where the second embedded die is an active die.

In Example 40, the subject matter of any one or more of Examples 26-39 where the embedded die is placed on the planarized first dielectric.

In Example 41, the subject matter of any one or more of Examples 26-40 optionally include placing a first surface die proximate an upper surface of the substrate.

In Example 42, the subject matter of Example 41 optionally includes placing a second surface die proximate an upper surface of the substrate.

In Example 43, the subject matter of Example 42 where each of the first and second surface die connect to one another in at least in part through the embedded die.

In Example 44, the subject matter of any one or more of Examples 26-43 where the carrier comprises, a support structure: and a patterned conductive layer supported on the support structure.

In Example 45, the subject matter of Example 44 where the patterned conductive layer is a metal foil formed on the support structure.

In Example 46, the subject matter of Example 45 optionally includes at least partially testing the substrate through use of the patterned conductive layer of the carrier structure.

In Example 47, the subject matter of Example 46 optionally includes removing the patterned conductive layer of the carrier structure from the substrate after the testing of the substrate.

In Example 48, the subject matter of any one or more of Examples 26-47 optionally include applying a stiffener to a surface of the substrate structure during manufacture of the substrate; and removing the substrate structure from the support structure of the carrier.

In Example 49, the subject matter of any one or more of Examples 47-48 optionally include drilling a lower via extending from a lower surface of the substrate to the embedded die.

Example 50 is a method of forming a microelectronic device, comprising: attaching an embedded die substrate to an interposer, the embedded die substrate housing at least a first embedded die, and further comprising, through silicon vias extending from a first surface of the substrate to an opposing second surface of the substrate, and conductive vias extending from a first surface to the first embedded die, the substrate having no more than a single layer of transverse routing traces; where the interposer comprises, multi-level routing interconnects between an upper set of contacts at an upper surface and a lower set of contacts at a lower surface; and securing first and second surface die above the first surface of the substrate.

In Example 51, the subject matter of Example 50 where the substrate comprises a single layer of transverse routing traces.

In Example 52, the subject matter of any one or more of Examples 50-51 where the single layer of transverse routing traces is proximate a surface of the substrate.

In Example 53, the subject matter of any one or more of Examples 50-52 where the single layer of transverse routing traces is proximate the first surface of the substrate.

In Example 54, the subject matter of any one or more of Examples 50-53 where the single layer of transverse routing traces is proximate a second surface of the substrate opposite the first surface.

Example 55 is an electronic system, comprising: a microelectronic device, comprising: a substrate housing at least a first embedded die, the substrate comprising, through contacts extending from a first surface of the substrate to an opposing second surface of the substrate, and contacts extending from a first surface to the first embedded die, the substrate having no more than a single layer of transverse routing traces; at least one surface die retained above the first surface of the substrate, the surface die electrically coupled to one or more of the contacts of the substrate; and an interposer retained proximate a second surface of the substrate, the interposer having a first set of multiple interposer contacts on a first surface, the first set of multiple interposer contacts coupled to respective substrate contacts, the interposer containing multiple conductive metal layers redistributing contacts of the first set of multiple interposer contacts to respective locations on an opposing second surface of the interposer; and at least one of a an additional semiconductor device, mass storage device and a network interface operably coupled to the microelectronic device.

In Example 56, the subject matter of Example 55 where the substrate comprises a single layer of transverse routing traces.

In Example 57, the subject matter of Example 56 where the single layer of transverse routing traces is proximate a surface of the substrate.

In Example 58, the subject matter of any one or more of Examples 56-57 where the single layer of transverse routing traces is proximate the first surface of the substrate.

In Example 59, the subject matter of any one or more of Examples 56-58 where the single layer of transverse routing traces is proximate a second surface of the substrate opposite the first surface.

In Example 60, the subject matter of any one or more of Examples 56-59 where the single layer of transverse routing traces is formed internal to the substrate.

In Example 61, the subject matter of any one or more of Examples 55-60 where the first embedded die is a bridge die.

In Example 62, the subject matter of any one or more of Examples 55-61 where the first embedded die is an active die.

In Example 63, the subject matter of any one or more of Examples 55-62 optionally include multiple contact surfaces proximate the second surface.

In Example 64, the subject matter of Example 63 where at least a portion of the through contacts in the substrate extend to the contact surfaces proximate the second surface.

In Example 65, the subject matter of any one or more of Examples 63-64 where the multiple contact surfaces proximate the second surface are generally flush with the second surface.

In Example 66, the subject matter of any one or more of Examples 55-65 optionally include a second embedded die.

In Example 67, the subject matter of any one or more of Examples 55-66 where at least a portion of the through contacts are arranged at a first pitch relative to one another, and where at least a portion of the contacts to the embedded die are arranged in a second pitch relative to one another, where the second pitch is narrower than the first pitch.

In Example 68, the subject matter of any one or more of Examples 55-67 where the embedded die is completely encased within the substrate, and is supported in spaced relation relative to the second surface.

In Example 69, the subject matter of any one or more of Examples 55-68 optionally includes an embedded die substrate formed through any of the processes of Examples 25-49.

In Example 70, the subject matter of any one or more of examples 55-68 optionally includes a microelectronic device formed according to any of the processes of examples the 50-54.

In Example 71, the subject matter of any one or more of examples 1-24 optionally includes an embedded die substrate formed according to any of the processes of examples 25-49.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "where." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A microelectronic device, comprising:
  a substrate housing at least a first embedded die, the substrate comprising through contacts extending from a first outermost surface of the substrate to an opposing second outermost surface of the substrate, wherein each of the through contacts is continuous along a vertical axis from the first outermost surface of the substrate to the opposing second outermost surface of the substrate, and wherein each of the through contacts comprises a conductive material, wherein the conductive material is continuous from the first outermost surface of the substrate to the opposing second outermost surface of the substrate, and the substrate comprising contacts extending from the first outermost surface to the at least a first embedded die;

at least one surface die retained above the first outermost surface of the substrate, the at least one surface die electrically coupled to one or more of the contacts of the substrate; and an interposer retained proximate the second outermost surface of the substrate, the interposer having a first set of multiple interposer contacts on a first surface, the first set of multiple interposer contacts coupled to respective ones of the through contacts of the substrate, the interposer containing multiple layers of traces redistributing contacts of the first set of multiple interposer contacts to respective locations on an opposing second surface of the interposer.

2. The microelectronic device of claim 1, wherein the substrate comprises a single layer of transverse routing traces.

3. The microelectronic device of claim 2, wherein the single layer of transverse routing traces is proximate a surface of the substrate.

4. The microelectronic device of claim 2, wherein the single layer of transverse routing traces is proximate the second outermost surface of the substrate.

5. The microelectronic device of claim 2, wherein the single layer of transverse routing traces is formed internal to the substrate.

6. The microelectronic device of claim 1, wherein the at least a first embedded die is a bridge die.

7. The microelectronic device of claim 1, wherein the at least a first embedded die is an active die.

8. The microelectronic device of claim 1, further comprising a second embedded die.

9. The microelectronic device of claim 1, wherein the substrate comprises a dielectric body in which the embedded die is retained.

10. The microelectronic device of claim 9, wherein the dielectric body comprises a first portion extending beneath the embedded die, wherein the first portion has a first planarized surface proximate the embedded die.

11. The microelectronic device of claim 10, wherein the first planarized surface is formed by grinding or chemical mechanical planarization.

12. An electronic system, comprising:

a microelectronic device, comprising:

a substrate housing at least a first embedded die, the substrate comprising through contacts extending from a first outermost surface of the substrate to an opposing second outermost surface of the substrate, wherein each of the through contacts is continuous along a vertical axis from the first outermost surface of the substrate to the opposing second outermost surface of the substrate, and wherein each of the through contacts comprises a conductive material, wherein the conductive material is continuous from the first outermost surface of the substrate to the opposing second outermost surface of the substrate, and the substrate comprising contacts extending from the first outermost surface to the at least a first embedded die;

at least one surface die retained above the first outermost surface of the substrate, the at least one surface die electrically coupled to one or more of the contacts of the substrate; and an interposer retained proximate the second outermost surface of the substrate, the interposer having a first set of multiple interposer contacts on a first surface, the first set of multiple interposer contacts coupled to respective ones of the through contacts of the substrate, the interposer containing multiple layers of traces redistributing contacts of the first set of multiple interposer contacts to respective locations on an opposing second surface of the interposer; and at least one of an additional semiconductor device, mass storage device and a network interface operably coupled to the microelectronic device.

13. The microelectronic device of claim 12, wherein the substrate comprises a single layer of transverse routing traces.

* * * * *